United States Patent
Yang et al.

(10) Patent No.: US 6,636,435 B2
(45) Date of Patent: Oct. 21, 2003

(54) FERROELECTRIC MEMORY CELL ARRAY AND METHOD OF STORING DATA USING THE SAME

(75) Inventors: Yil Suk Yang, Daejon-Shi (KR); Tae Moon Roh, Daejon-Shi (KR); Jong Dae Kim, Daejon-Shi (KR); Byoung Gon Yu, Daejon-Shi (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 10/032,987

(22) Filed: Dec. 27, 2001

(65) Prior Publication Data

US 2003/0099127 A1 May 29, 2003

(30) Foreign Application Priority Data

Nov. 23, 2001 (KR) ........................................ 2001-73393

(51) Int. Cl.$^7$ .............................................. G11C 11/22
(52) U.S. Cl. ....................................... 365/145; 365/149
(58) Field of Search ................................. 365/145, 149

(56) References Cited

U.S. PATENT DOCUMENTS

| | | | |
|---|---|---|---|
| 5,592,409 A | 1/1997 | Nishimura et al. | ......... 365/145 |
| 6,411,542 B1 * | 6/2002 | Yang et al. | .................. 365/145 |

OTHER PUBLICATIONS

Betty Prince, "Semiconductor Memories", 1983, Wiley, 2$^{nd}$ edition, pp. 654–655.*
Jpn. J. Appl. Phys. vol. 36 (1997) pp. 1655–1658, Proposal of a Single–Transistor–Cell Type Ferroelectric Memory Using an SOI Structure and Experimental Study on the Interference Problem in the Write Operation, H. Ishiwara, T. Shimamura and E Tokumitsu.
IEE International Solid State Circuits Converence, 1995, "A Single–Transistor Ferroelectric Memory Cell", 3 pages.

* cited by examiner

Primary Examiner—M. Tran
(74) Attorney, Agent, or Firm—Blakely, Sokoloff, Taylor & Zafman

(57) ABSTRACT

The present invention relates to a ferroelectric memory cell array formed of a single transistor, and method of storing data using the same. The ferroelectric memory cell array includes a plurality of word lines connected to gates of the memory cells located at respective rows, a plurality of bit lines connected to drains of the memory cells located at respective columns, a common source line commonly connecting sources of the memory cells, and a plurality of well lines each connected to wells in which the memory cells are each formed, wherein a bias voltage of an unit pulse shape is applied to a gate of a selected memory cell and a bias voltage of a pulse shape is applied to a well line. Therefore, the present invention allows a random access without a disturbance since data can be written by means of the polarity characteristic of the ferroelectric.

4 Claims, 4 Drawing Sheets

FERROELECTRIC MEMORY CELL ARRAY AND METHOD OF STORING DATA USING THE SAME

BACKGROUND OF THE INVENTION

1. Field of the Invention

The invention relates generally to a ferroelectric memory cell array and method of storing data using the same, and more particularly to, a non-volatile ferroelectric memory cell array, which is made of a plurality of ferroelectric memory cells formed of a single transistor, can be applied to a device having MFS (Metal Ferroelectric Semiconductor), MFIS (Metal Ferroelectric Insulator Semiconductor) and MFMIS (Metal Ferroelectric Metal Insulator Semiconductor) structure and can be randomly accessed, and method of storing data using the same.

2. Description of the Prior Art

Generally, a transistor of a MOS structure has a gate insulating film and a gate, which are stacked on a semiconductor substrate, and source and drain where impurity ions are implanted into the semiconductor substrate at both sides of the gate. The gate insulating film usually includes an oxide film ($SiO_2$) and the MOS transistor is driven by a voltage applied to the gate.

On the contrary, a ferroelectric memory cell made of a single transistor uses a ferroelectric such as PZT, SBT and the like as the gate insulating film and writes data depending on the polarity characteristic of the ferroelectric.

A non-volatile ferroelectric memory cell maintains its polarity charge even when a supply of the power is stopped. In other words, data is hold by a hysteresis characteristic between the voltage and the storage charge of the ferroelectric. The non-volatile ferroelectric memory cell may consist of one or two transistors and one or two capacitors, or may consist of only a single transistor as a storage element.

FIG. 1 is a graph showing a charge—voltage hysteresis characteristic of a ferroelectric. When the voltage is 0V, the amount of charge Q may have two different values C and E. Therefore, data of a first state E or a second state C is stored in the ferroelectric memory cell using a characteristic that the polarity stat of the ferroelectric is positioned in a constant direction depending on the voltage applied between thin films.

FIGS. 2a and 2b are a structure for explaining an operating principle of a ferroelectric memory cell made of an N channel single transistor. FIG. 2a illustrates a polarity direction in a state that a positive (+) voltage is applied between a gate 3 and a well formed in a P type substrate 1. At this time, charges are induced on the surface of the substrate 1. FIG. 2b illustrates a polarity direction in a state that a negative (−) voltage is applied between the gate 3 and the well formed in the P type substrate 1. At this time, charges are not induced on the surface of the substrate 1. Reference numeral 2 indicates a ferroelectric film and reference numerals 4 and 5 indicate source and drain, respectively.

FIG. 3a is a circuit diagram showing a memory cell array made of a conventional ferroelectric memory cell formed of a single transistor. A plurality of ferroelectric memory cells M formed on a common well are connected between a plurality of word lines WL1~WLn and bit lines BL1~BLm. In other words, gates of the memory cells M1~Mm existing in the same row are connected to the word line WL1. In the same manner, gates of the memory cells Mn~Mn+m existing in an nth row are connected to a word line WLn. Drains of the memory cells M1~Mn existing in the same column are connected to a bit line BL1. In the same manner, drains of the memory cells Mn~Mn+m existing in an m-th column are connected to a bit line BLm. Also, sources of the memory cells existing in respective columns are connected to source lines SL1~SLn, respectively and the well is connected to a common well line WELL.

For example, in the memory cell array, in order to write data of a first state in a single selected memory cell Mn, the supply power Vdd is applied to the word line WLn and a ground voltage GND is applied to the bit line BL1 and the source line SL1. At this time, in order for not-selected memory cells not to be programmed, the ground voltage GND is applied to remaining word lines WL1~WLn−1 and the supply power Vdd is applied to the source lines SL2~SLn and the bit lines BL2~BLm, respectively, as shown in FIG. 3b.

Meanwhile, in order to write data of a second state in the memory cell, the ground voltage GND must be applied to the gate and the supply power Vdd must be applied to the source, drain and well, respectively. In this case, a bias voltage is applied to the memory cells in the entire arrays since the memory cell could not be individually selected.

Therefore, as the conventional memory cell array is constructed so that a given cell could not be independently selected, a random access operation is not allowed. Also, there occurs a write disturb phenomenon in a not-selected memory cell upon a write operation. For example, if unwanted data is written into a memory cell that was experienced by a drain disturb or data is written into a neighboring memory cell, there occurs a phenomenon that data written into the memory cell that was experienced by the drain disturb are repeatedly changed. Thus, reliability of a device is degraded by the write disturb that destruct thus stored data.

In this reason, a non-volatile memory device using a conventional ferroelectric memory cell array in which each cell is formed of a single transistor has not been commercialized.

SUMMARY OF THE INVENTION

The present invention is contrived to solve the problems and an object of the present invention is to provide a ferroelectric memory cell array in which a source of a memory cell is connected to a common source line and a well bias voltage is applied through well lines each connected to wells of each of memory cells, and method of storing data using the same.

In order to accomplish the above object, a ferroelectric memory cell array according to the present invention, is characterized in that it comprises a plurality of word lines located in rows; a plurality of bit lines located in columns; a plurality of memory cells connected between the word lines and the bit lines, in which each of the memory cells is composed of a well formed in a substrate; a thin ferroelectric film formed on the substrate over the well; a gate formed on the thin ferroelectric film; and a source and a drain formed in the well at both sides of the gate, a common source line connected to sources of the memory cells; and a plurality of well lines each connected to corresponding one of wells of the memory cells and electrically isolated from each other.

A method of storing data using a ferroelectric memory cell array according to the present invention is characterized in that the ferroelectric memory cell array comprises a plurality of word lines located in rows; a plurality of bit lines located in columns; a plurality of memory cells connected between the word lines and the bit lines, in which each of the memory cells is composed of a well formed in a substrate; a thin ferroelectric film formed on the substrate over the well; a gate formed on the thin ferroelectric film; and a source and a drain formed in the well at both sides of the gate, a common source line connected to sources of the memory cells; and a plurality of well lines each connected to corresponding one of wells of the memory cells and electrically isolated with each other; and the method comprises the steps of selecting a memory cell by applying a given bias voltage to a selected word line and bit line in order to store data into a selected memory cell of the ferroelectric memory cell array; and writing data into the selected memory cell by means of the difference in the voltage between the selected word line and the well line.

Upon the writing operation, a voltage applied to the selected word line is shifted from the supply power to the ground voltage, and a voltage applied to the well line is shifted from the ground voltage to the supply power and then shifted to the ground voltage.

Upon the writing operation, the supply power is applied to a not-selected word line and the ground voltage is applied to a not-selected well line.

The present invention provides a memory cell array in which a plurality of ferroelectric memory cells formed of a single transistor are connected between a plurality of word lines and bit lines. Data is written into respective memory cells depending on its polarity characteristic and the written data is read by a method using variations in the threshold voltage. More particularly, the present invention allows a random access without disturb by connecting sources of each of the memory cells to a common source line and applying a well bias voltage through well lines each connected to wells of each of the memory cells.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
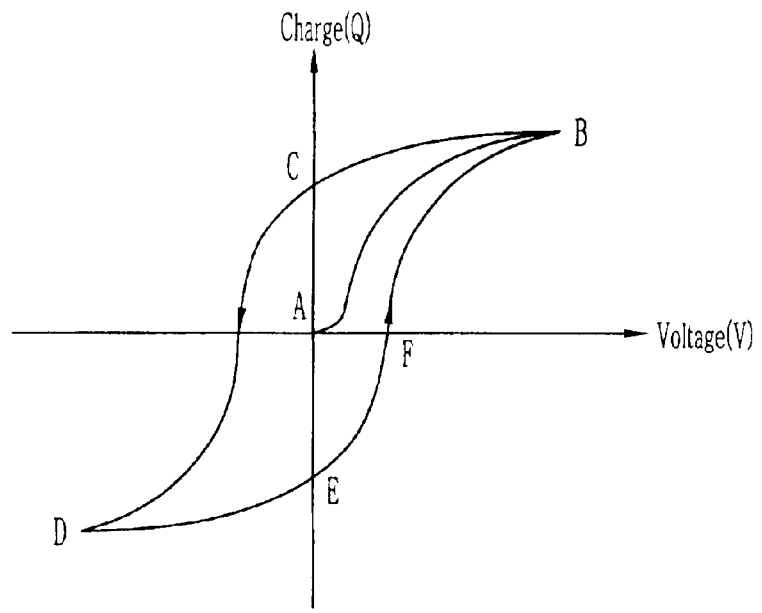
FIG. 1 is a graph showing a charge—voltage hysteresis characteristic of a ferroelectric.
Figure 2A:
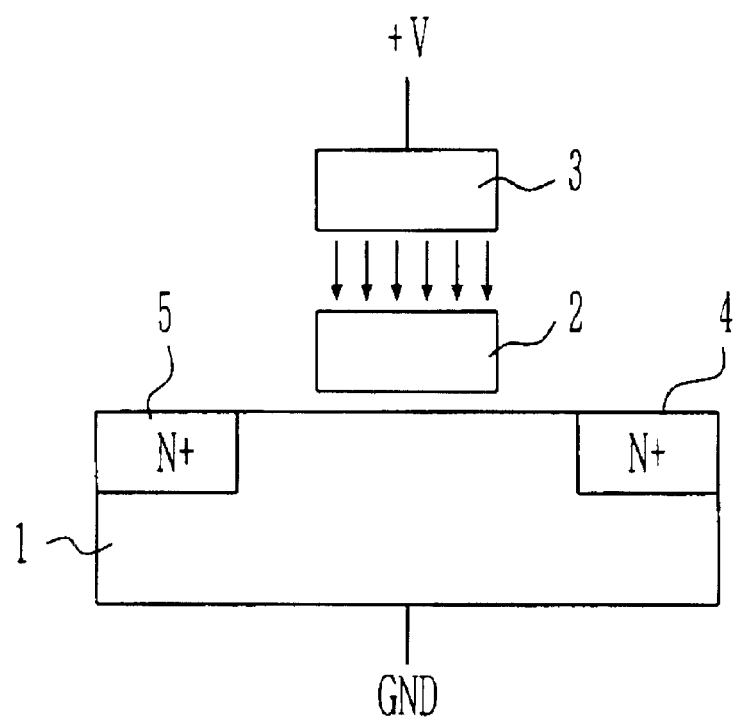
FIGS. 2a and 2b are structures for explaining an operating principle of a ferroelectric memory cell made of an N channel single transistor.
Figure 2B:
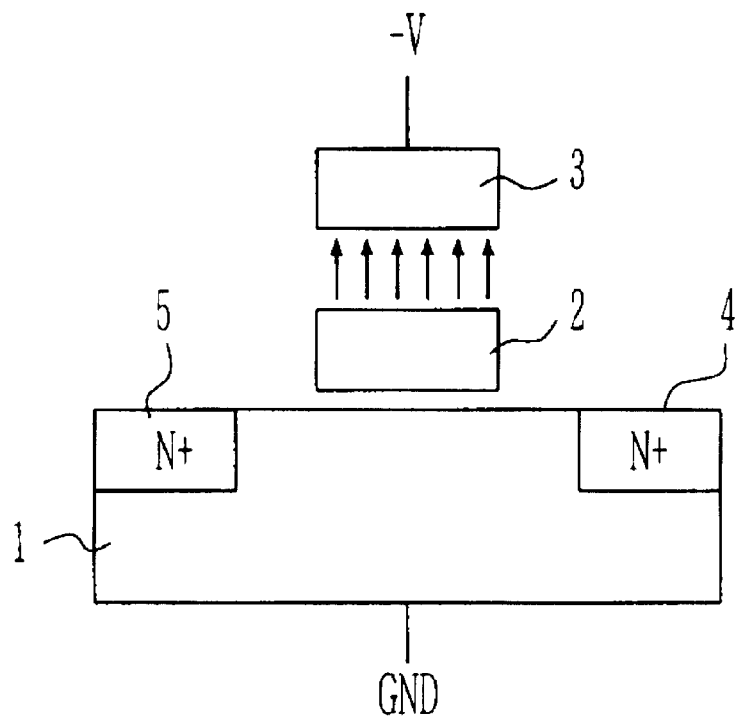
Figure 3A:
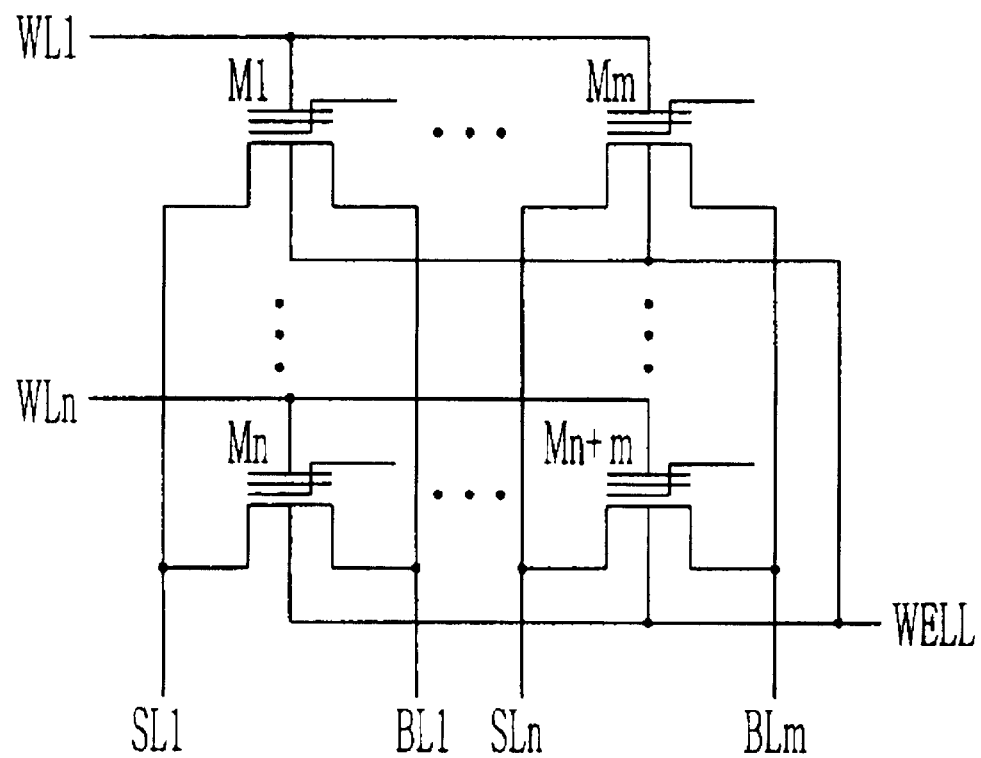
FIGS. 3a and 3b are circuit diagrams for explaining a conventional ferroelectric memory cell array.
Figure 3B:
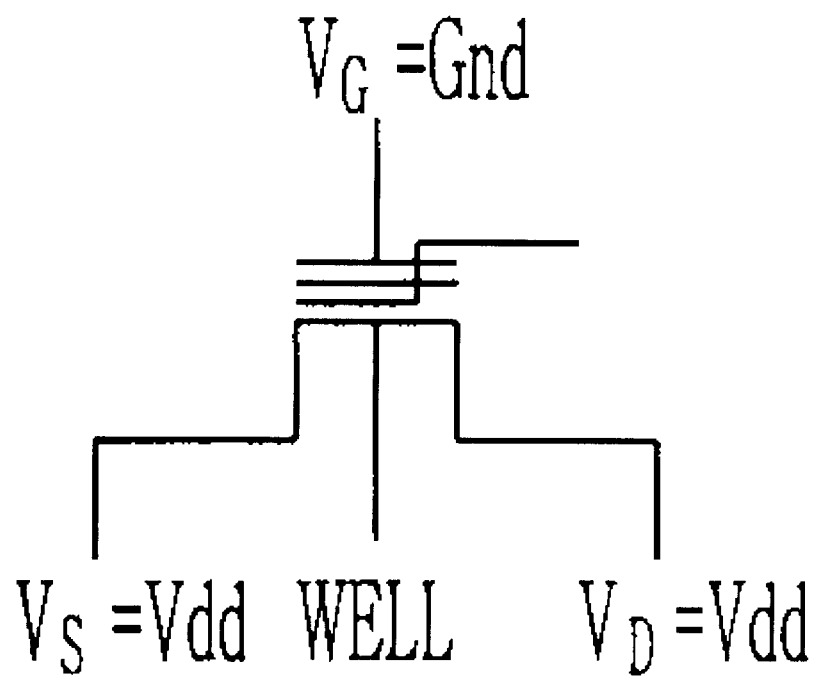

The present invention will be described in detail by way of a preferred embodiment with reference to accompanying drawings, in which like reference numerals are used to identify the same or similar parts.

Figure 4:
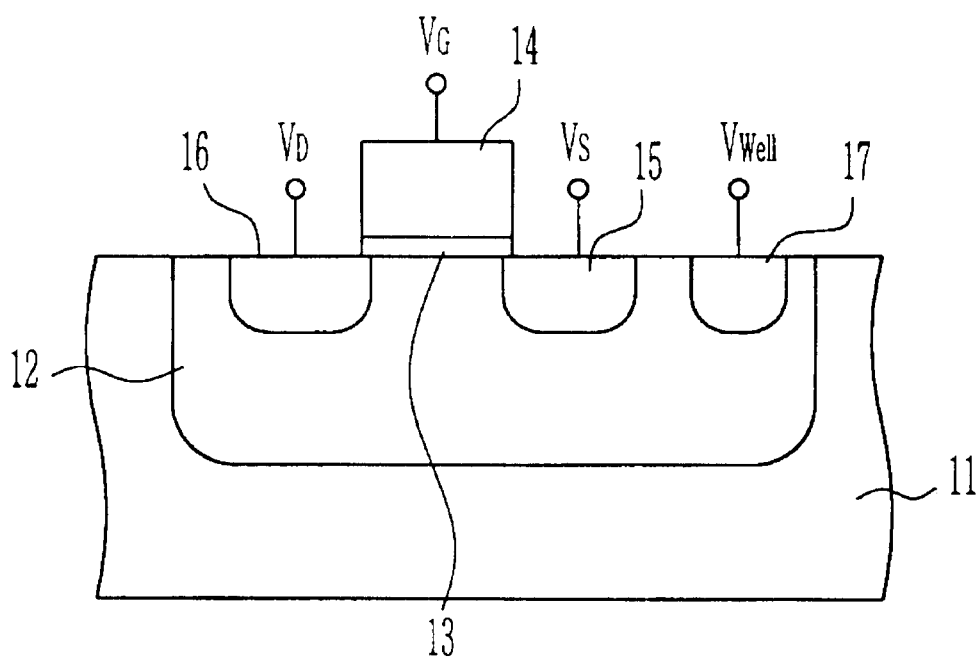
FIG. 4 is a cross-sectional view for explaining a structure of a ferroelectric memory cell made of a P channel single transistor.

FIG. 4 is a cross-sectional view for explaining a structure of a ferroelectric memory cell made of a P channel single transistor.

A gate insulating film 13 and a gate 14 are stacked on a well 12 formed on a substrate 11. A source and a drain 15 and 16 are formed on the substrate 11 at both sides of the gate 14. A back gate region 17 for applying a bias voltage Vwell is formed in the well 12. The well 12 and the substrate 11 have opposite conductive types and the source and drain 15 and 16 have an opposite conductive type to the well 12.

The gate insulating film 13 preferably uses a ferroelectric such as PZT, SBT and the like but not limited to the ferroelectric, and may use all the materials having other ferroelectric characteristic.

Data of a first state and a second state is written into the ferroelectric memory cell formed of a single transistor. In order to read the written data, a bias voltage is applied to the gate 14, the source 15, the drain 16 and the well 12, respectively. Data is (not written into a ferroelectric memory cell formed of a P channel single transistor if the voltage difference between the gate 14 and the well 12 is positive (+) and data is written into the ferroelectric memory cell formed of a P channel single transistor if the voltage difference between the gate 14 and the well 12 is negative (−).

Figure 5:
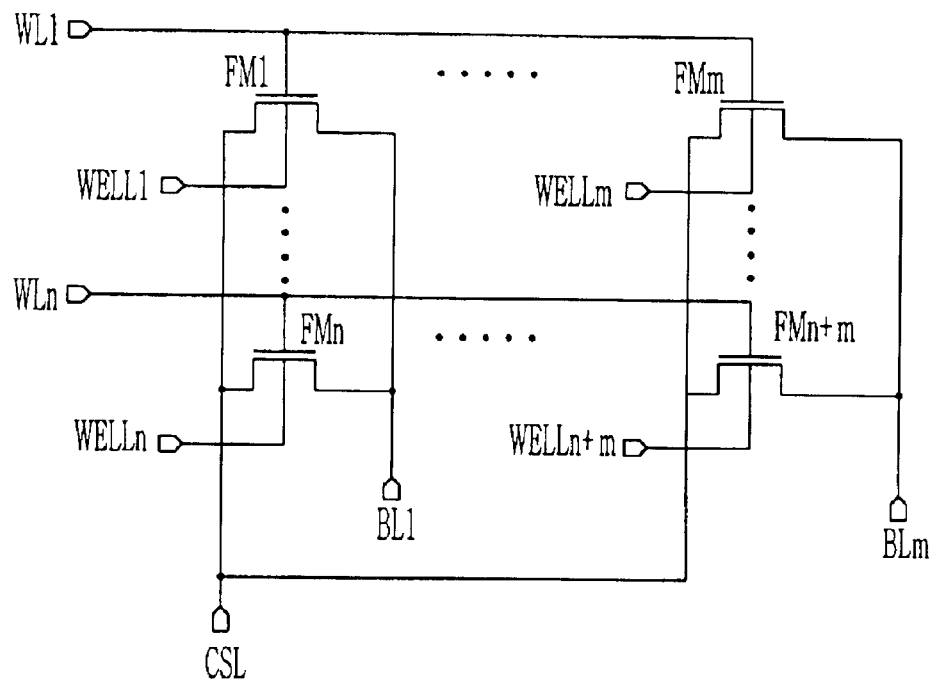
FIG. 5 is a circuit diagram for explaining a ferroelectric memory cell array according to the present invention.

FIG. 5 is a circuit diagram of a memory cell array according to the present invention, which is constructed using the ferroelectric memory cell in FIG. 4.

Gates of memory cells FM1~FMm existing in the same row are connected to a word line WL1. In the same manner, gates of memory cells FMn~FMn+m existing in an n-th row are connected to a word line WLn. Meanwhile, drains of memory cells FM1~FMn existing in the same column are connected to a bit line BL1. In the same manner, drains of memory cells FMm~FMn+m existing in an m-th column are connected to a bit line BLm. Also, sources of each of the memory cells FM are connected to a common source line CSL. Wells of each of the memory cell, that is, wells in which the memory cells each are formed are connected to respective well lines WELL1~WELLn, . . . WELLn~WELLn+m electrically isolated.

In the memory cell array constructed above, in order for a reverse-direction PN junction to be formed between the common source line CSL and respective wells, the common source line CSL must be grounded and the supply power Vdd or the ground voltage GND must be applied to N well lines of each of the cells, in case of a ferroelectric memory cell formed of a P channel single transistor. Also, in case of a ferroelectric memory cell formed of a N channel single transistor, the supply power Vdd must be connected to the common source line CSL and the supply power Vdd or the ground voltage GND must be applied to P well lines of each of the cells.

A process of writing and reading data into and from each of the memory cells will be below described.

For example, in order to write data of a first state into a ferroelectric memory cell FMn formed of a P channel single transistor, a voltage supplied to the word line WLn is shifted from the supply power Vdd to the ground voltage GND and a voltage supplied to the well line WELLn is shifted from the ground voltage GND to the supply power Vdd. In other words, in a reset state, the supply power Vdd is applied to the word line WLn and the ground voltage GND is applied to the well line WELLn, so that the voltage difference between the word line WLn and the well line WELLn becomes positive (+) to initialize the polarity. In this state, if the ground voltage GND is applied to the word line WLn and the supply power Vdd is applied to the well line WELLn, the voltage difference between the word line WLn and the well line WELLn becomes negative (−), so that writing can be performed.

At this time, a write disturb is not generated by applying the ground voltage GND to each of the well lines of not-selected memory cells and the supply power Vdd to respective word lines so that an initial polarity state can be kept in tact.

Meanwhile, in order to write data of a second state into the ferroelectric memory cell FMn, the supply power Vdd is applied to the word line WLn and the ground voltage GND is applied to the well line WELLn.

The present invention has a plurality of well lines each connected to the wells formed in each of the memory cells for the purpose of a random access operation.

A voltage (the supply power→the ground voltage→the supply power or the ground voltage→the supply power→the ground voltage of a pulse shape) is applied to the well lines of each of the cells and a voltage (the ground voltage→the supply power or the supply power→the ground voltage of an unit pulse shape) is applied to the word lines. In other words, a voltage of a selected state is intact supplied to the word lines and a voltage of a pulse shape is supplied to the well lines, so that a random access operation is allowed.

The threshold voltage of the memory cell programmed by the above method is increased while the threshold voltage of a not-programmed memory cell is kept to be low. Therefore, in order to read data stored at a give selected memory cell, a bias voltage is applied to the word line connected to the selected memory cell and a sensing voltage is applied between the bit line and the source line. At this time, if the memory cell is programmed, there is rarely a flow of current through the memory cell since the read voltage applied to the gate is lower than the threshold voltage. On the contrary, if the memory cell is not programmed, there is a flow of current since the voltage of the gate is higher than the threshold voltage. Therefore, the difference in the amount of current is sensed by an operation of a sense amplifier connected to the bit line so that the state of stored data can be read.

Figure 6:
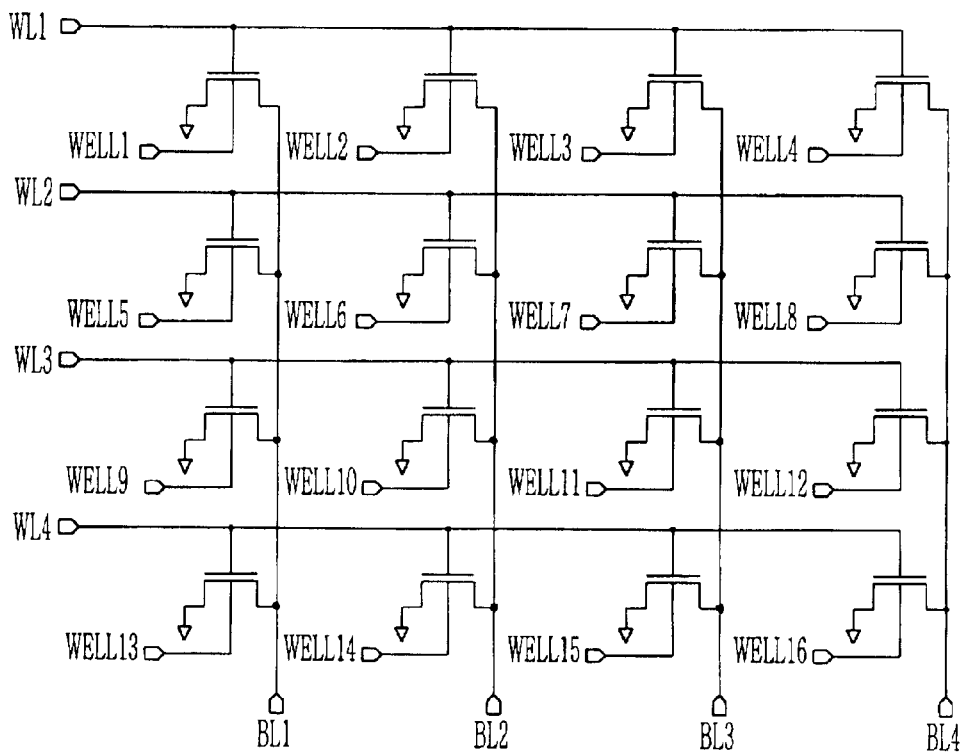
FIG. 6 is a circuit diagram for explaining one embodiment of the ferroelectric memory cell array according to the present invention.

FIG. 6 is a circuit diagram for explaining one embodiment of the ferroelectric memory cell array according to the present invention. In the same manner to FIG. 5, there is shown a structure a plurality of memory cells are arranged in a 4 column and 4 row (4×4).

As mentioned above, the present invention constructs a memory cell array using a ferroelectric memory cell formed of a single transistor, for writing the polarity characteristic of a ferroelectric and reading written data using the variation in the threshold voltage. The ferroelectric memory cell array has sources of each of the memory cells connected to a common source line and has a well line for applying a well bias voltage to wells of each of the memory cell. Therefore, according to the present invention, data can be independently written into a single selected memory cell and the written data can be read from the selected memory cell. Thus, the present invention has an outstanding effect that it allows a random access operation and prevents a disturbance without using additional circuit upon a writing and read to improve reliability of a device. Further, the memory cell array of the present invention can simplify its internal circuit structure since it can perform a write operation only using the supply power and the ground voltage.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A ferroelectric memory cell array, comprising:
   a plurality of word lines located in rows;
   a plurality of bit lines located in columns;
   a plurality of memory cells connected between said word lines and said bit lines, in which each of said memory cells including:
      a well formed in a substrate;
      a thin ferroelectric film formed on said substrate over said well;
      a gate formed on said thin ferroelectric film; and
      a source and a drain formed in said well at both sides of said gate,
   a common source line connected to said source of said memory cells; and
   a plurality of well lines each connected to corresponding one of wells of said memory cells, said well lines electrically isolated from each other.

2. A method of storing data using a ferroelectric memory cell array, said ferroelectric memory cell array including a plurality of word lines located in rows; a plurality of bit lines located in columns; a plurality of memory cells connected between said word lines and said bit lines, in which each of said memory cells is composed of a well formed in a substrate; a thin ferroelectric film formed on said substrate over said well; a gate formed on said thin ferroelectric film; and a source and a drain formed in said well at both sides of said gate, a common source line connected to sources of said memory cells; and a plurality of well lines each connected to corresponding one of wells of said memory cells,
   said method, comprising the steps of:
      selecting a memory cell by applying a given bias voltage to a selected word line and a bit line in order to store data into a selected memory cell of said ferroelectric memory cell array; and
      writing data into said selected memory cell using the difference in the voltage between the selected word line and the well line,
      wherein upon said writing operation, a voltage applied to the selected word line is shifted from the supply power to the ground voltage, and a voltage applied to the well lines is shifted from the ground voltage to the supply power and then shifted to the ground voltage.

3. The method of storing data using a ferroelectric memory cell array as claimed in claim 2, wherein upon said writing operation, the supply power is applied to a not-selected word line and the ground voltage is applied to a not-selected well line.

4. A ferroelectric memory cell array comprising:
   a plurality of word lines and bit lines arranged in rows and columns;
   a plurality of ferroelectric memory cells connected between said word lines and said bit lines; and
   a plurality of well lines each connected to each well of said memory cells and being electrically isolated from each other.

* * * * *